(12) United States Patent
Kim et al.

(10) Patent No.: US 8,895,982 B2
(45) Date of Patent: Nov. 25, 2014

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Jeong-Hwan Kim, Yongin (KR); Jong-Hyun Park, Yongin (KR); Seong-Kweon Heo, Yongin (KR); Kyung-Hoon Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/016,830

(22) Filed: Sep. 3, 2013

(65) Prior Publication Data

US 2014/0319471 A1 Oct. 30, 2014

(30) Foreign Application Priority Data

Apr. 25, 2013 (KR) ........................ 10-2013-0046207

(51) Int. Cl.
| | |
|---|---|
| *H01L 23/58* | (2006.01) |
| *H01L 21/66* | (2006.01) |
| *H01L 27/32* | (2006.01) |

(52) U.S. Cl.
CPC ............ *H01L 27/3244* (2013.01); *H01L 22/32* (2013.01); *H01L 22/14* (2013.01)
USPC ................... 257/48; 257/40; 257/59; 257/72; 438/14; 438/99; 438/34

(58) Field of Classification Search
CPC .. H01L 27/3244; H01L 22/32; H01L 27/1214
USPC ................. 257/48, 40, 59, 72; 438/14, 99, 34
See application file for complete search history.

(56) References Cited

U.S. PATENT DOCUMENTS 8,772,778 B2 * 7/2014 Yamazaki et al. .............. 257/59
2006/0238450 A1 10/2006 Onodera

FOREIGN PATENT DOCUMENTS

| KR | 10-2004-0057150 A | 7/2004 |
|---|---|---|
| KR | 10-2006-0075173 A | 7/2006 |
| KR | 10-2006-0105521 A | 10/2006 |
| KR | 10-2012-0065159 A | 6/2012 |

* cited by examiner

*Primary Examiner* — Tu-Tu Ho
(74) *Attorney, Agent, or Firm* — Christie, Parker & Hale, LLP

(57) ABSTRACT

An organic light-emitting display apparatus in which electrical communication between an opposing electrode and an electrode power supply line can be more easily checked without adding an additional process in a manufacturing process, and a method of manufacturing the organic light-emitting display apparatus, is provided. The organic light-emitting display apparatus includes thin film transistors and pixel electrodes electrically connected to the thin film transistors in an active area of a substrate, an opposing electrode in the active area and a dead area of the substrate, an electrode power supply line in the dead area of the substrate and having a surface contacting the opposing electrode and configured to supply power to the opposing electrode, and a test line in the dead area of the substrate separated from the electrode power supply line and contacting the opposing electrode.

20 Claims, 5 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2013-0046207, filed on Apr. 25, 2013, in the Korean Intellectual Property Office, the disclosure of which is incorporated herein in its entirety by reference.

BACKGROUND

1. Field

Embodiments of the present invention relate to an organic light-emitting display apparatus and a method of manufacturing the organic light-emitting display apparatus, and more particularly, to an organic light-emitting display apparatus having a structure that can more easily check whether an opposing electrode smoothly performs electrical communication with an electrode power supply line, without adding an additional process in a manufacturing process, and a method of manufacturing the organic light-emitting display apparatus.

2. Description of the Related Art

In general, an organic light-emitting display apparatus has an organic light-emitting diode (OLED) as a pixel. Light emission or a degree of light emission of each OLED is adjusted through a thin film transistor (TFT). An OLED includes a pixel electrode electrically connected to a TFT, an opposing electrode facing the pixel electrode, and an intermediate layer interposed between the pixel electrode and the opposing electrode and having a light-emitting layer. The opposing electrode is integrally formed with respect to a plurality of pixels. The opposing electrode contacts an electrode power supply line disposed in a dead area that is a non-display area, outside of an active area that is a display area, and receives an electrical signal from the electrode power supply line.

In a conventional organic light-emitting display apparatus, the opposing electrode covers the electrode power supply line located thereunder. Accordingly, after the opposing electrode is formed in a manufacturing process, it is impossible to measure a contact resistance between the opposing electrode and the electrode power supply line, in order to check whether the opposing electrode and the electrode power supply line appropriately or sufficiently contact each other.

SUMMARY

Embodiments of the present invention provide an organic light-emitting display apparatus having a structure that can more easily check whether an opposing electrode smoothly performs electrical communication with an electrode power supply line, without adding an additional process in a manufacturing process, and a method of manufacturing the organic light-emitting display apparatus.

According to an aspect of an embodiment of the present invention, an organic light-emitting display apparatus includes a substrate having an active area and a dead area, a plurality of thin film transistors in the active area of the substrate, a plurality of pixel electrodes in the active area of the substrate and electrically connected to corresponding ones of the plurality of thin film transistors, an opposing electrode in the active area and the dead area of the substrate corresponding at least to the plurality of pixel electrodes, an electrode power supply line in the dead area of the substrate and having a surface contacting the opposing electrode to supply power to the opposing electrode, and a test line in the dead area of the substrate, the test line separated from the electrode power supply line and contacting the opposing electrode.

The electrode power supply line may be on a same layer as one of source/drain electrodes or a gate electrode of each of the plurality of thin film transistors. The electrode power supply line may have a same layer structure and include a same material as the one of the source/drain electrodes or the gate electrode of each of the plurality of thin film transistors.

The electrode power supply line may be on a same layer as one of source/drain electrodes or a gate electrode of each of the plurality of thin film transistors, and the test line may be on a same layer as the other one of the source/drain electrodes or the gate electrode of each of the plurality of thin film transistors.

The organic light-emitting display apparatus may further include an interlayer insulating film interposed between source/drain electrodes and a gate electrode of each of the plurality of thin film transistors and arranged over the active area and the dead area of the substrate, and an external interlayer insulating film in the dead area of the substrate to be separated from the interlayer insulating film and including a same material and a same layer structure as the interlayer insulating film, wherein the electrode power supply line is positioned closer to the active area of the substrate and corresponding to a space between the interlayer insulating film and the external interlayer insulating film, and the test line is positioned farther away from the active area of the substrate and corresponding to the space between the interlayer insulating film and the external interlayer insulating film.

The opposing electrode may contact an end surface of the interlayer insulating film facing the external interlayer insulating film, wherein the opposing electrode contacts an end surface of the external interlayer insulating film facing the interlayer insulating film.

According to another aspect of the present invention, an organic light-emitting display apparatus includes a substrate having an active area and a dead area, a plurality of thin film transistors in the active area of the substrate, a plurality of pixel electrodes in the active area of the substrate and electrically connected to corresponding ones of the plurality of thin film transistors, an opposing electrode in the active area and the dead area of the substrate corresponding at least to the plurality of pixel electrodes, a connection portion in the dead area of the substrate and having a surface contacting the opposing electrode, an electrode power supply line contacting the connection portion and configured to supply power to the opposing electrode via the connection portion, and a test line in the dead area of the substrate, the test line separated from the electrode power supply line and the connection portion and contacting the opposing electrode.

The electrode power supply line may be on a same layer as a gate electrode of each of the plurality of thin film transistors.

The electrode power supply line may have a same layer structure and include a same material as the gate electrode of each of the plurality of thin film transistors.

The connection portion and the test line may be on a same layer as source/drain electrodes of each of the plurality of thin film transistors.

The connection portion and the test line may have a same layer structure and include a same material as the source/drain electrodes of each of the plurality of thin film transistors.

According to another aspect of the present invention, a method of manufacturing an organic light-emitting display apparatus includes preparing a substrate having an active area and a dead area, forming a plurality of thin film transistors in the active area of the substrate, an electrode power supply line in the dead area of the substrate and having a first test terminal, and a test line in the dead area of the substrate separated from the electrode power supply line and having a second test terminal, forming a plurality of pixel electrodes in the active area of the substrate to be electrically connected to corresponding ones of the plurality of thin film transistors, and forming an opposing electrode in the active area and the dead area of the substrate corresponding at least to the plurality of pixel electrodes and having a surface contacting the electrode power supply line and contacting the test line.

The electrode power supply line may have a same layer structure and include a same material as one of source/drain electrodes or a gate electrode of each of the plurality of thin film transistors, the electrode being formed on the same layer as the electrode power supply line, and the test line may have a same layer structure and include a same material as the other one of the source/drain electrodes or the gate electrode of each of the plurality of thin film transistors, the other electrode being formed on the same layer as the test line.

One of source/drain electrodes or a gate electrode of each of the thin film transistors, the electrode power supply line, and the test line may be formed on a same layer, have a same layer structure, and include a same material.

The method may further include connecting a constant current source to the first test terminal and the second test terminal, and measuring a first voltage of the first test terminal and a second voltage of the second test terminal to measure a contact resistance between the electrode power supply line and the opposing electrode.

According to another aspect of the present invention, a method of manufacturing an organic light-emitting display apparatus includes preparing a substrate having an active area and a dead area, forming a plurality of thin film transistors in the active area of the substrate, an electrode power supply line in the dead area of the substrate and having a first test terminal, a connection portion contacting the electrode power supply line, and a test line in the dead area of the substrate separated from the electrode power supply line and the connection portion and having a second test terminal, forming a plurality of pixel electrodes in the active area of the substrate to be electrically connected to corresponding ones of the plurality of thin film transistors, and forming an opposing electrode in the active area and the dead area of the substrate corresponding at least to the plurality of pixel electrodes and having a surface contacting the connection portion and contacting the test line.

A gate electrode of each of the plurality of thin film transistors and the electrode power supply line may be formed on a same layer, have a same layer structure, and include a same material, while source/drain electrodes of each of the plurality of thin film transistors and the connection portion may be formed on a same layer, have a same layer structure, and include a same material. The test line may be formed on the same layer, have the same layer structure, and include the same material as one of the electrode power supply line or the connection portion.

The method may further include connecting a constant current source to the first test terminal and the second test terminal, and measuring a first voltage of the first test terminal and a second voltage of the second test terminal to measure a contact resistance between the connection portion and the opposing electrode.

BRIEF DESCRIPTION OF THE DRAWINGS

The above and other features and advantages of the present invention will become more apparent by describing in detail exemplary embodiments thereof, with reference to the attached drawings, in which.

DETAILED DESCRIPTION

Figure 1:
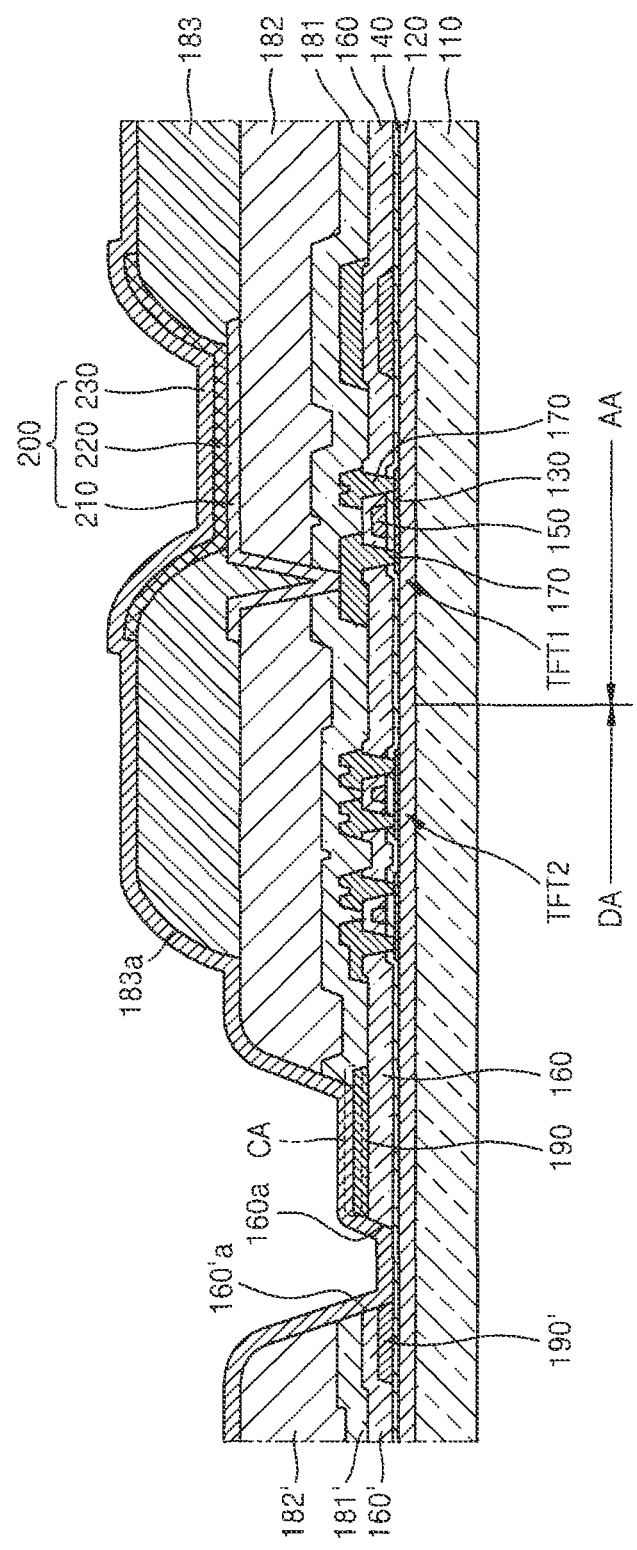
FIG. 1 is a cross-sectional view schematically illustrating an organic light-emitting display apparatus according to an embodiment of the present invention.

The attached drawings illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Also, the thickness or size of each layer illustrated in the drawings is exaggerated for convenience of explanation and clarity. Like reference numerals in the drawings denote like elements.

As used herein, the term "and/or" includes any and all combinations of one or more of the associated listed items. Expressions such as "at least one of," when preceding a list of elements, modify the entire list of elements and do not modify the individual elements of the list.

In the following description, an x-axis, a y-axis, and a z-axis are not limited to three axes on a rectangular coordinate system and may be interpreted in a broad sense including the above meaning. For example, the x-axis, y-axis, and z-axis may be perpendicular to one another or may indicate different directions that are not perpendicular to one another.

Also, in the following description, when a constituent element, such as a layer, a film, a region, or a plate, is described to exist on another constituent element, the constituent element may exist directly on the other constituent element, or another constituent element may be interposed therebetween.

FIG. 1 is a cross-sectional view schematically illustrating an organic light-emitting display apparatus according to an embodiment of the present invention. Referring to FIG. 1, the organic light-emitting display apparatus according to the present embodiment includes a substrate 110 that has an active area AA that is a display area, and a dead area DA that is a non-display area. The substrate 110 may be formed of various materials such as a glass material, a metal material, or a plastic material. A plurality of thin film transistors TFT1s are arranged in the active area AA of the substrate 110. A plurality of organic light-emitting diodes (OLEDs) 200 that are electrically connected to the thin film transistors TFT1s may also be arranged in the active area AA. The electrical connection of the OLEDs 200 to the thin film transistors TFT1s may signify that a plurality of pixel electrodes 210 are electrically connected to the thin film transistors TFT1s. A thin film transistor TFT2 may be arranged in the dead area DA of the substrate 110. The thin film transistor TFT2 may be, for example, a part of a circuit portion to control an electrical signal applied to the active area AA.

The thin film transistor TFT1 or the thin film transistor TFT2 may include a semiconductor layer 130 that includes amorphous silicon, polycrystal silicon, or an organic semiconductor material, a gate electrode 150, and source/drain electrodes 170. A buffer layer 120 is provided on the substrate 110 to prevent intrusion of impurities into the semiconductor layer 130 or to planarize a surface of the substrate 110. The buffer layer 120 is formed of silicon oxide or silicon nitride. The semiconductor layer 130 may be disposed on the buffer layer 120.

The gate electrode 150 is arranged on the semiconductor layer 130. The source/drain electrodes 170 electrically communicate with each other according to a signal applied to the gate electrode 150. The gate electrode 150 may be formed of, for example, one or more of the materials aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and can be formed as a single layer or as multiple layers in consideration of closeness with a neighboring layer, a surface levelness of a deposited layer, processability, etc. To secure insulation between the semiconductor layer 130 and the gate electrode 150, a gate insulating film 140 may be interposed between the semiconductor layer 130 and the gate electrode 150. The gate insulating film 140 is formed of silicon oxide and/or silicon nitride.

Interlayer insulating films 160 and 160' may be arranged on the gate electrode 150. The interlayer insulating films 160 and 160' are formed of a material such as silicon oxide and/or silicon nitride, as a single layer or as multiple layers. As described later, a test line 190' is arranged in the dead area DA, outside of the active area AA. The interlayer insulating films 160 and/or 160' have an opening and/or a via hole exposing at least a part of the test line 190'.

When the interlayer insulating films 160 and 160' have a via hole, the interlayer insulating films 160 and 160' may be provided as one body. Meanwhile, when the interlayer insulating films 160 and 160' have an opening, the interlayer insulating films 160 and 160' may be separated from each other in some cases, in which the interlayer insulating film 160' may be referred to as an external interlayer insulating film, for convenience of explanation. In the latter case, the interlayer insulating film 160 may be interposed between the gate electrode 150 and the source/drain electrodes 170 of the thin film transistor TFT1 throughout the active area AA and the dead area DA of the substrate 110. The external interlayer insulating film 160' may be disposed in the dead area DA of the substrate 110 to be separated from the interlayer insulating film 160, and may contain a material that the interlayer insulating film 160 contains, and may have the same layer structure as the interlayer insulating film 160.

The source/drain electrodes 170 are arranged on the interlayer insulating film 160. The source/drain electrodes 170 are electrically connected to the semiconductor layer 130 through contact holes formed in the gate insulating film 140 and the interlayer insulating film 160. The source/drain electrodes 170 may be formed of, for example, one or more of the materials aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and can be formed as a single layer or as multiple layers in consideration of conductivity, etc.

To protect the thin film transistor TFT1 having the above structure, first insulating films 181 and 181' may be arranged to cover the thin film transistor TFT1. The first insulating films 181 and 181' may be formed of an inorganic matter such as silicon oxide, silicon nitride, or silicon oxynitride. Although FIG. 1 illustrates the first insulating films 181 and 181' as a single layer, various modifications thereof are available, for example, the first insulating films 181 and 181' may have a multiple layer structure. As described later, the electrode power supply line 190 and the test line 190' may be arranged in the dead area DA, outside of the active area AA, in which the first insulating films 181 and 181' have an opening and/or a via hole that exposes at least part of the electrode power supply line 190 and/or the test line 190'.

Second insulating films 182 and 182' may be arranged on the first insulating films 181 and 181', as necessary. For example, when the OLED 200 is arranged on the thin film transistor TFT1 as illustrated in FIG. 1, the second insulating films 182 and 182' may be arranged as planarization films to substantially planarize upper surfaces of the first insulating films 181 and 181' that cover the thin film transistor TFT1. The second insulating films 182 and 182' may be formed of, for example, acryl-based organic matter or benzocyclobutene (BCB). Although FIG. 1 illustrates the second insulating films 182 and 182' as a single layer, various modifications thereof are available, for example, the second insulating films 182 and 182' may be multiple layers. The second insulating films 182 and 182' have an opening and/or a via hole that exposes at least part of the electrode power supply line 190 and/or the test line 190'.

When the first insulating films 181 and 181' have a via hole, the first insulating films 181 and 181' may be provided as one body. Meanwhile, when the first insulating films 181 and 181' have an opening, the first insulating films 181 and 181' may be separated from each other in some cases. Here, the first insulating film 181' may be referred to as a first external insulating film for convenience of explanation. When the second insulating films 182 and 182' similarly have a via hole, the second insulating films 182 and 182' may be provided as one body. Meanwhile, when the second insulating films 182 and 182' have an opening, the second insulating films 182 and 182' may be separated from each other in some cases. Here, the second insulating film 182' may be referred to as a second external insulating film for convenience of explanation.

In the active area AA of the substrate 110, the OLED 200 is arranged on the second insulating film 182. The OLED 200 includes the pixel electrode 210, an opposing electrode 230, and an intermediate layer 220 interposed between the pixel electrode 210 and the opposing electrode 230. The intermediate layer 220 includes a light-emitting layer.

An opening exposing at least one of the source/drain electrodes 170 of the thin film transistor TFT1 is formed in the first insulating film 181 and the second insulating film 182. The pixel electrode 210 that contacts one of the source/drain electrodes 170 through the opening to be electrically connected to the thin film transistor TFT1 is arranged on the second insulating film 182. The pixel electrode 210 may be formed to be a transparent or semitransparent electrode or a reflective electrode. When the pixel electrode 210 is formed to be a transparent or semitransparent electrode, the pixel electrode 210 may be formed of, for example, ITO, IZO, ZnO, $In_2O_3$, IGO, or AZO. When the pixel electrode 210 is formed to be a reflective electrode, the pixel electrode 210 may include a reflective film that is formed of Ag, Mg, Al, Pt, Pd, Au, Ni, Nd, Ir, Cr, or a compound thereof, and/or a layer that is formed of ITO, IZO, ZnO, $In_2O_3$, IGO, or AZO. However, the present invention is not limited thereto, and a variety of materials may be employed herein, and a structure thereof may be variously modified, for example, as a signal layer or as multiple layers.

A third insulating film 183 may be formed on the second insulating film 182. The third insulating film 183 is a pixel-defining film that has an opening corresponding to each of the sub-pixels, that is, an opening exposing at least a center portion of the pixel electrode 210, thereby defining a pixel. Also, as illustrated in FIG. 1, the third insulating film 183 increases a distance between an edge portion of the pixel electrode 210 and the opposing electrode 230 above the pixel electrode 210, in order to prevent the occurrence of arcs at the edge portions of the pixel electrode 210. The third insulating film 183 is arranged on the second insulating film 182, but not in the dead area DA outside of the active area AA, as illustrated in FIG. 1. If necessary, the second insulating film 182 may be arranged in the dead area DA. The third insulating film 183 may be formed of organic matter, such as polyimide.

The intermediate layer 220 of the OLED 200 may contain a low-molecular or polymer material. When the intermediate layer 220 contains a low-molecular material, the intermediate layer 220 is formed by stacking a hole injection layer (HIL), a hole transport layer (HTL), an emission layer (EML), an electron transport layer (ETL), and an electron injection layer (EIL) in a single or combined structure. In this case, the intermediate layer 220 may be formed of various organic materials, for example, copper phthalocyanine (CuPc), N,N'-Di(naphthalene-1-yl)-N,N'-diphenyl-benzidine (NPB), tris-8-hydroxyquinoline aluminum (Alq3), etc. These layers may be formed by a vacuum deposition method.

When the intermediate layer 220 contains a polymer material, the intermediate layer 220 may mostly have a structure including the HTL and the EML. Polyethylenedioxythiophene (PEDOT) is used for the HTL, and a polymer material, such as a poly-phenylenevinylene (PPV)-based material or a polyfluorene-based material, is used for the EML. The HTL and the EML may be formed by a screen printing method, an inkjet printing method, a laser-induced thermal imaging (LITI) method, etc. However, the intermediate layer 220 is not limited thereto, and a variety of structures may be employed herein.

The opposing electrode 230 that is arranged above the active area AA may cover the active area AA, as illustrated in FIG. 1. In other words, the opposing electrode 230 in the OLEDs 200 may be provided as one body to correspond to the pixel electrodes 210. The opposing electrode 230 may be arranged over the active area AA and the dead area DA of the substrate 110. The opposing electrode 230 may be formed to be a transparent or semitransparent electrode or as a reflective electrode. When the opposing electrode 230 is formed to be a transparent or semitransparent electrode, the opposing electrode 230 may include a layer formed of a metal having a relatively small work function, for example, Li, Ca, LiF/Ca, LiF/Al, Al, Ag, Mg, or a compound thereof, and a transparent or semitransparent conductive layer formed of ITO, IZO, ZnO, or $In_2O_3$. When the opposing electrode 230 is formed to be a reflective electrode, the opposing electrode 230 may include a layer formed of, for example, Li, Ca, LiF/Ca, LiF/Al, Al, Ag, Mg, or a compound thereof. The structure and material of the opposing electrode 230 are not limited thereto, and a variety of modifications thereof are available.

The electrode power supply line 190 and the test line 190' that is physically separated from the electrode power supply line 190 are arranged in the dead area DA, outside of the active area AA of the substrate 110. The opposing electrode 230 is arranged over the active area AA and the dead area DA of the substrate 110 and contacts the electrode power supply line 190 and the test line 190' in the dead area DA. In particular, the opposing electrode 230 has a surface contact with the electrode power supply line 190, and may receive electrode power.

The electrode power supply line 190 may be disposed close to the active area AA of the substrate 110, corresponding to or near a space between the interlayer insulating film 160 and the external interlayer insulating film 160'. The test line 190' may be disposed farther away from the active area AA of the substrate 110, and may also correspond to or be near a space between the interlayer insulating film 160 and the external interlayer insulating film 160'. The opposing electrode 230 may contact an end surface 160a of the interlayer insulating film 160, where the end surface 160a of the interlayer insulating film 160 faces the external interlayer insulating film 160'. The opposing electrode 230 may also contact an end surface 160'a of the external interlayer insulating film 160', where the end surface 160'a of the external interlayer insulating film 160' faces the interlayer insulating film 160.

As described above, in a conventional organic light-emitting display apparatus, there is a problem where, after the opposing electrode 230 is formed in a manufacturing process, measuring a contact resistance between the opposing electrode 230 and the electrode power supply line 190 to check whether the opposing electrode 230 and the electrode power supply line 190 appropriately or sufficiently contact each other is impossible. However, in the organic light-emitting display apparatus according to the present invention, since the test line 190' contacting the opposing electrode 230 is provided in addition to the electrode power supply line 190, the contact resistance between the electrode power supply line 190 and the opposing electrode 230 may be more effectively measured.

Figure 2:
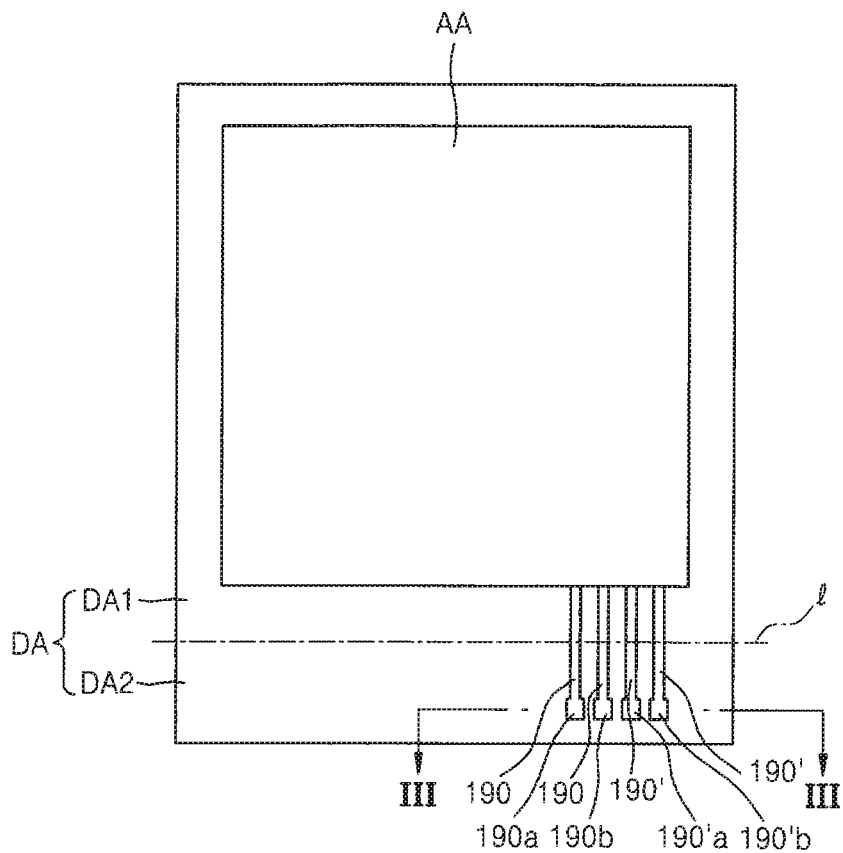
FIG. 2 is a plan view schematically illustrating a state of the organic light-emitting display apparatus of FIG. 1 in a manufacturing process.
Figure 3:
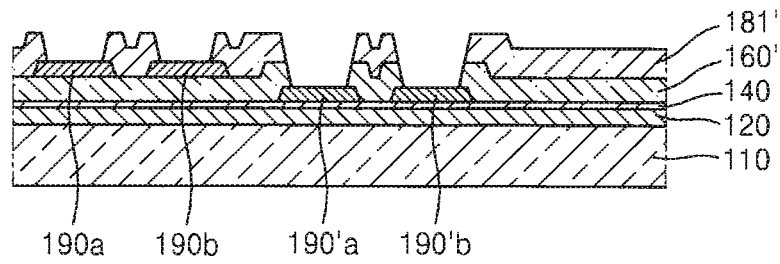
FIG. 3 is a cross-sectional view taken along line III-III of FIG. 2.

FIG. 2 is a plan view schematically illustrating a state of the organic light-emitting display apparatus of FIG. 1 in a manufacturing process. FIG. 3 is a cross-sectional view taken along line III-III of FIG. 2.

Referring to FIGS. 2 and 3, the electrode power supply line 190 is extended from the active area AA to a second dead area DA2 via a first dead area DA1. The electrode power supply line 190 is branched into two lines 190 and extended to the second dead area DA2. The lines 190 may have first test terminals 190a and 190b at one end of the second dead area DA2. Although FIGS. 2 and 3 illustrate that the electrode power supply line 190 is branched into two lines 190 in the active area AA and extended to the second dead area DA2 via the first dead area DA1, the present invention is not limited thereto. For example, the electrode power supply line 190 may be branched into the two lines 190 in the first dead area DA1. The first test terminals 190a and 190b may be exposed to the outside through openings formed in the layers formed above the first test terminals 190a and 190b. In FIG. 3, the first test terminals 190a and 190b are exposed to the outside through openings formed in the first insulating film 181' that is formed above the first test terminals 190a and 190b.

The test line 190' is also extended from the active area AA to the second dead area DA2 via the first dead area DA1. The test line 190' is branched into two lines 190' and extended to the second dead area DA2. The test lines 190' may have second test terminals 190'a and 190'b at one end of the second dead area DA2. Although FIGS. 2 and 3 illustrate that the test line 190' is branched into two lines 190' in the active area AA and extended to the second dead area DA2 via the first dead area DA1, the present invention is not limited thereto. For example, the test line 190' may be branched into the two lines 190' in the first dead area DA1. The second test terminals 190'*a* and 190'*b* may also be exposed to the outside through openings formed in layers formed above the second test terminals 190'*a* and 190'*b*. In FIG. 3, the second test terminals 190'*a* and 190'*b* are exposed to the outside through the openings formed in the first insulating film 181' and the interlayer insulating film 160' that are formed above the second test terminals 190'*a* and 190*b*.

In the above state, a constant current source is connected to the first test terminal 190*a* and the second test terminal 190'*a*, and then a first voltage of the first test terminal 190*b* and a second voltage of the second test terminal 190'*b* are measured. Accordingly, a contact resistance on a contact surface CA (see FIG. 1) between the electrode power supply line 190 and the opposing electrode 230 may be measured. In other words, when a constant current source is connected to the first test terminal 190*a* and the second test terminal 190'*a*, a value obtained by dividing the difference between the first voltage of the first test terminal 190*b* and the second voltage of the second test terminal 190'*b* by a current value of the constant current source may be determined to be a rough contact resistance between the electrode power supply line 190 and the opposing electrode 230.

When a contact resistance value is in a preset or desired range, it is confirmed that the electrode power supply line 190 and the opposing electrode 230 appropriately contact each other. Otherwise, it is confirmed that a contact error occurs between the electrode power supply line 190 and the opposing electrode 230.

As such, after the contact resistance between the electrode power supply line 190 and the opposing electrode 230 is roughly measured to check whether there is a contact error between the electrode power supply line 190 and the opposing electrode 230, the substrate 110 is cut along a line l between the first dead area DA1 and the second dead area DA2. Accordingly, the first test terminals 190*a* and 190*b* or the second test terminals 190'*a* and 190'*b* may be removed or may otherwise not be left in a final organic light-emitting display apparatus. Even in the above case, however, the final organic light-emitting display apparatus unavoidably has a structure including the test line 190' contacting the opposing electrode 230, in addition to the electrode power supply line 190, as illustrated in FIG. 1. An end surface of a leading end of the electrode power supply line 190 or the test line 190' may be aligned to an end surface of an edge of the substrate 110.

The electrode power supply line 190 may be disposed on the same layer s one of the source/drain electrodes 170 and/or the gate electrode 150 of the thin film transistor TFT1. In this case, the electrode power supply line 190 may have the same layer structure and the same material as said one of the source/drain electrodes 170 and/or the gate electrode 150 of the thin film transistor TFT1. In other words, in the manufacturing process, the electrode power supply line 190 may be simultaneously formed with one of the source/drain electrodes 170 and/or the gate electrode 150 of the thin film transistor TFT1, that is, the one or ones being disposed on the same layer as the electrode power supply line 190. In FIGS. 1 to 3, the electrode power supply line 190 is simultaneously formed with the source/drain electrodes 170 of the thin film transistor TFT1 and arranged on the interlayer insulating film 160.

The test line 190' may also be disposed on the same layer as one of the source/drain electrodes 170 and/or the gate electrode 150 of the thin film transistor TFT1. In this case, the test line 190' may have the same layer structure and the same material as said one of the source/drain electrodes 170 and/or the gate electrode 150 of the thin film transistor TFT1. In other words, in the manufacturing process, the test line 190' may be simultaneously formed with one of the source/drain electrodes 170 and/or the gate electrode 150 of the thin film transistor TFT1, that is, the one or ones being disposed on the same layer as the test line 190'. In FIGS. 1 to 3, the test line 190' is simultaneously formed with the gate electrode 150 of the thin film transistor TFT1 and arranged on the gate insulating film 140 formed on the buffer layer 120.

Figure 4:
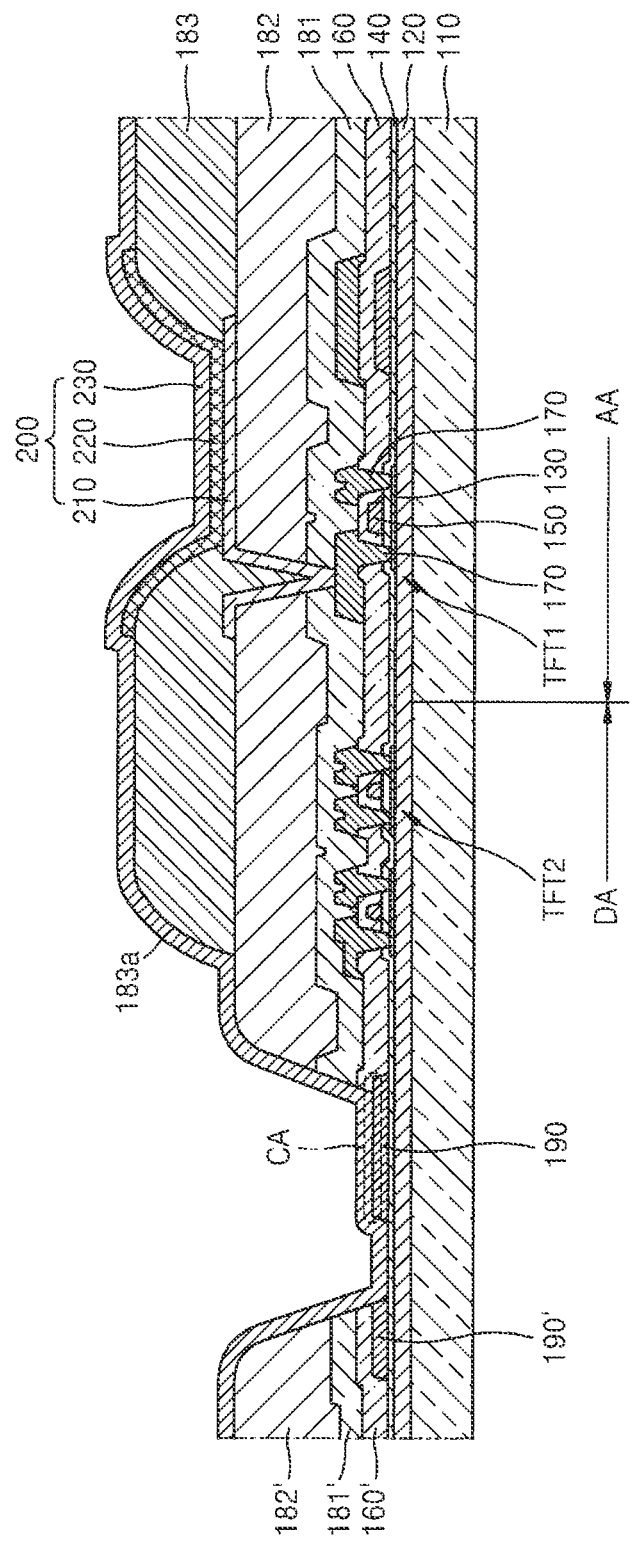
FIG. 4 is a cross-sectional view schematically illustrating an organic light-emitting display apparatus according to another embodiment of the present invention.

The present invention is not limited to the structure illustrated in FIGS. 1 to 3. For example, as illustrated in FIG. 4 that schematically illustrates an organic light-emitting apparatus according to another embodiment of the present invention, the electrode power supply line 190 and the test line 190' may be disposed on the same layer. In FIG. 4, the electrode power supply line 190 and the test line 190' are arranged on the same layer as the gate electrode 150 of the thin film transistor TFT1. However, this is a mere example and the electrode power supply line 190 and the test line 190' may alternatively be arranged on the same layer as the source/drain electrodes 170 of the thin film transistor TFT1. When the electrode power supply line 190 and the test line 190' are formed in different layers, a degree of freedom in selecting the positions thereof may be increased such that, for example, the electrode power supply line 190 and the test line 190' may cross each other (on different planes) until they reach the first test terminals 190*a* and 190*b* and the second test terminals 190'*a* and 190'*b*.

Also, while the electrode power supply line 190 and the test line 190' may be arranged in different layers, unlike the illustration in FIG. 1, the electrode power supply line 190 may be arranged on the same layer as the gate electrode 150 of the thin film transistor TFT1, and the test line 190' may be arranged on the same layer as the source/drain electrodes 170 of the thin film transistor TFT1. The elements, including the electrode power supply line 190 or the test line 190', that are formed on the same corresponding layer may be formed of the same material and have the same layer structure.

Figure 5:
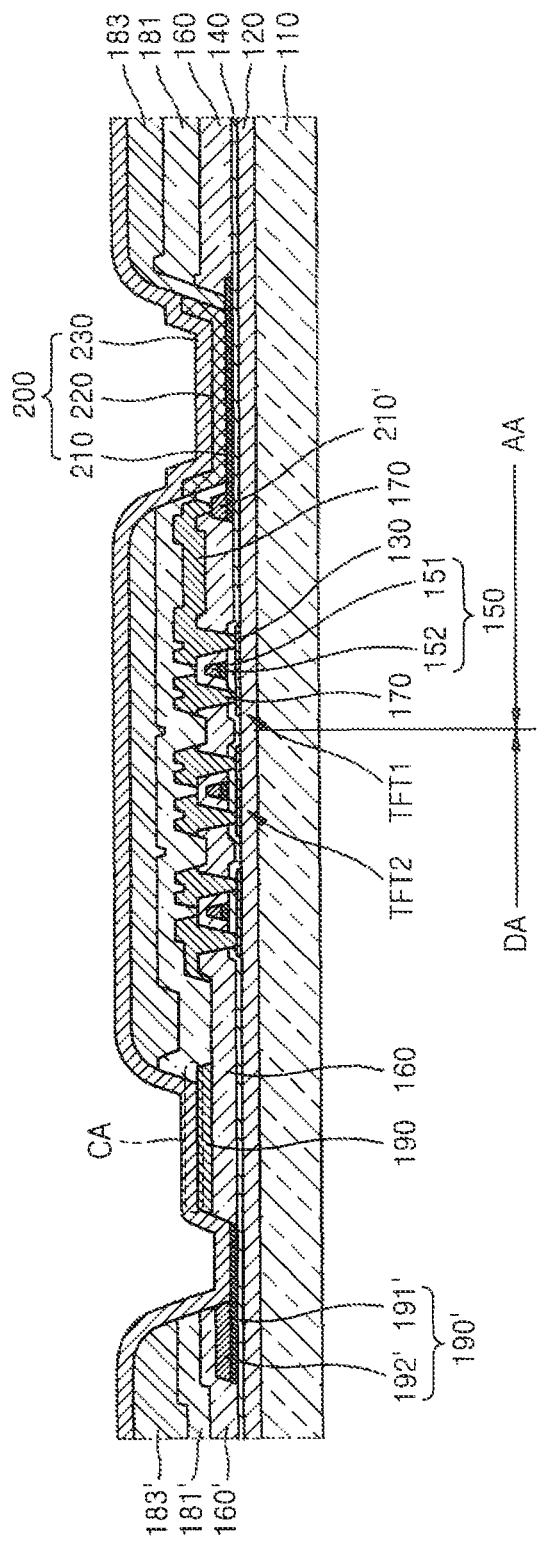
FIG. 5 is a cross-sectional view schematically illustrating an organic light-emitting display apparatus according to yet another embodiment of the present invention.

FIG. 5 is a cross-sectional view schematically illustrating an organic light-emitting display apparatus according to another embodiment of the present invention. In the organic light-emitting display apparatus of the present embodiment, the gate electrode 150 includes a first conductive layer 151 and a second conductive layer 152.

Referring to FIG. 5, the first conductive layer 151 may contain, for example, ITO, IZO, ZnO, $In_2O_3$, IGO, or AZO, and may be formed to be a transparent or semitransparent electrode. The second conductive layer 152 may be arranged on the first conductive layer 151, may contain a metal, such as Mo, MoW, an Al-based alloy, etc., or an alloy thereof, and may have a structure of a single layer or of combined layers. The second conductive layer 152 may have, for example, a Mo/Al/Mo stack structure.

The pixel electrode 210 may be disposed on the same layer as the first conductive layer 151 of the gate electrode 150 of the thin film transistor TFT1. Also, a conductive portion 210' may be disposed on a predetermined area of the pixel electrode 210, if necessary. The conductive portion 210' may be disposed on the same layer as the second conductive layer 152 of the gate electrode 150 of the thin film transistor TFT1. In other words, when the gate electrode 150 of the thin film transistor TFT1 is formed, the pixel electrode 210 and a conductive layer covering the pixel electrode 210 may be formed at the same time, and then the conductive layer may be patterned to form the conductive portion 210'.

One of the source/drain electrodes 170 of the thin film transistor TFT1 contacts the conductive portion 210' so as to be electrically connected to the pixel electrode 210. In the manufacturing process, in a state where the conductive layer on the pixel electrode 210 is not patterned, another conductive layer can be formed to form the source/drain electrodes 170 (to cover the conductive layer on the pixel electrode 210). As the other conductive layer is patterned, the conductive layer on the pixel electrode 210 can be patterned at the same time, so that portions not part of the conductive portion 210' may be removed.

In the above structure, since the pixel electrode 210 of the OLED 200 is simultaneously formed while the thin film transistor TFT1 is formed, the manufacturing process may be simpler than a case in which the OLED 200 is disposed above the thin film transistor TFT1. In addition, since the OLED 200 is disposed roughly on the same layer as the thin film transistor TFT1, the overall thickness of the organic light-emitting display apparatus may be further decreased compared to embodiments where the OLED 200 is disposed above the thin film transistor TFT1.

One of the electrode power supply line 190 and the test line 190', the one being disposed on the same layer as the gate electrode 150 of the thin film transistor TFT1, may have the same structure as the gate electrode 150. FIG. 5 illustrates that the test line 190' is disposed on the same layer as the gate electrode 150 of the thin film transistor TFT1. The test line 190' includes a first test line layer 191' and a second test line layer 192'.

Figure 6:
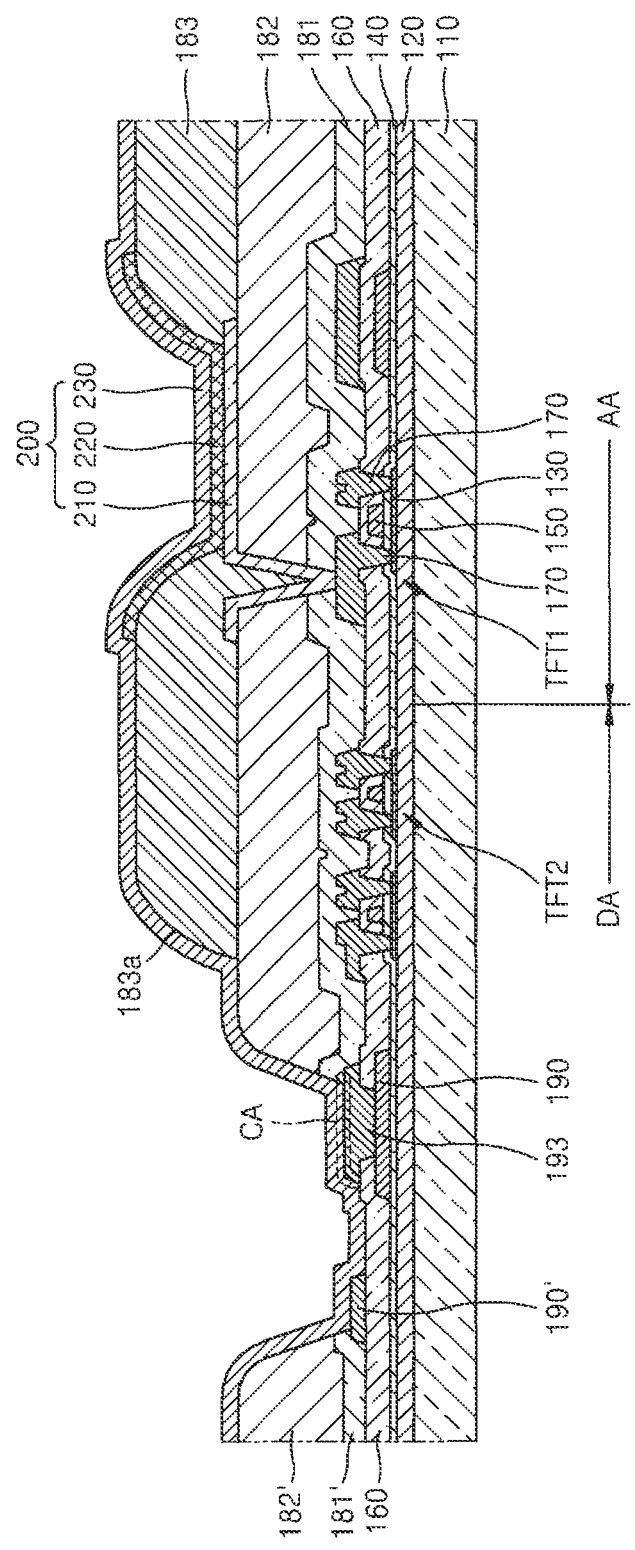
FIG. 6 is a cross-sectional view schematically illustrating an organic light-emitting display apparatus according to still another embodiment of the present invention.

FIG. 6 is a cross-sectional view schematically illustrating an organic light-emitting display apparatus according to another embodiment of the present invention. In the organic light-emitting display apparatus of the present embodiment, the electrode power supply line 190 is not directly connected to the opposing electrode 230, but the electrode power supply line 190 is electrically connected to the opposing electrode 230 via a connection portion 193, that in turn has a surface contacting the opposing electrode 230.

In this case, the electrode power supply line 190 may be disposed on the same layer as the gate electrode 150 of the thin film transistor TFT1. In other words, the electrode power supply line 190 is simultaneously formed with the gate electrode 150 and has the same layer structure and the same material as the gate electrode 150. Meanwhile, the connection portion 193 and the test line 190' may be disposed on the same layer as the source/drain electrodes 170 of the thin film transistor TFT1. In other words, the connection portion 193 and the test line 190' are simultaneously formed with the source/drain electrodes 170, to accordingly have the same layer structure and the same material as the source/drain electrodes 170.

In this state, a constant current source is connected to a first test terminal extended from the electrode power supply line 190 and a second test terminal extended from the test line 190'. Then, a first voltage of the first test terminal and a second voltage of the second test terminal are measured, and thus a contact resistance at the contact surface CA between the connection portion 193 and the opposing electrode 230 may be measured. The first test terminal and the second test terminal may have, for example, a shape similar to that shown in FIG. 2. As the constant current source is connected to the first test terminal and the second test terminal, a value obtained by dividing a difference between the first voltage of the first test terminal and the second voltage of the second test terminal by a current value of the constant current source may be roughly determined to be a contact resistance between the connection portion 193 and the opposing electrode 230.

As such, when the contact resistance value is in a desired or preset range, it may be confirmed that the connection portion 193 and the opposing electrode 230 appropriately contact each other. Otherwise, it may be confirmed that a contact error occurs between the connection portion 193 and the opposing electrode 230.

As a modified example of the organic light-emitting display apparatus of FIG. 6, the test line 190' may be disposed on the same layer as the electrode power supply line 190. In other words, the test line 190' may be simultaneously formed with the electrode power supply line 190 and the gate electrode 150 and may have the same layer structure and the same material as the electrode power supply line 190 and the gate electrode 150. When the electrode power supply line 190 and the test line 190' are formed in different layers, a degree of freedom in selecting the positions thereof may be increased such that, for example, the electrode power supply line 190 and the test line 190' may cross each other (on different planes) until they reach the first test terminals 190a and 190b or the second test terminals 190'a and 190'b.

As a modified example of the organic light-emitting display apparatus of FIG. 6, the gate electrode 150 of the thin film transistor TFT1 may have a double layer structure as illustrated in FIG. 5, and the pixel electrode 210 of the OLED 200 may be disposed on the same layer as a first conductive layer 151 of the gate electrode 150.

The present invention is not limited to the above descriptions of embodiments of the organic light-emitting display apparatus. For example, a method of manufacturing an organic light-emitting display apparatus falls within the scope of the present invention as well.

In a method of manufacturing an organic light-emitting display apparatus, according to an embodiment of the present invention, the substrate 110 having the active area AA and the dead area DA is prepared. The buffer layer 120 may be formed on the substrate 110.

After the substrate 110 is prepared, the thin film transistors TFT1s disposed in the active area AA of the substrate 110, the electrode power supply line 190 disposed in the dead area DA of the substrate 110 and having the first test terminals 190a and 190b at one end thereof, and the test line 190' disposed in the dead area DA of the substrate 110 to be separated from the electrode power supply line 190 and having the second test terminals 190'a and 190'b at one end thereof, are formed.

At this time, as illustrated in FIG. 1, the electrode power supply line 190 may be simultaneously formed with one of the source/drain electrodes 170 and/or the gate electrode 150 of the thin film transistor TFT1, the one being disposed on the same layer and having the same layer structure and the same material as the electrode power supply line 190. The test line 190' may be simultaneously formed with the other one of the source/drain electrodes 170 or the gate electrode 150 of the thin film transistor TFT1, the other electrode(s) being disposed on the same layer and having the same layer structure and the same material as the test line 190'. Alternatively, as illustrated in FIG. 4, the electrode power supply line 190 and the test line 190' may be simultaneously formed with one of the source/drain electrodes 170 and/or the gate electrode 150 of the thin film transistor TFT1, the one being disposed on the same layer and having the same layer structure and the same material as the electrode power supply line 190 and the test line 190'.

Then, the pixel electrodes 210 are formed in the active area AA of the substrate 110 to be electrically connected to the thin film transistors TFT1s. The opposing electrode 230 is formed over the active area AA and the dead area DA of the substrate 110 to have a surface contact with the electrode power supply line 190 and to contact the test line 190', thereby manufacturing an organic light-emitting display apparatus.

In some embodiments, when the electrode power supply line 190 and the test line 190' are formed, and the thin film transistor TFT1 is formed, the pixel electrode 210 may also be formed at the same time as the thin film transistor TFT1 is formed, as described with reference to FIG. 5.

According to the method of manufacturing an organic light-emitting display apparatus, according to the present embodiment, the test line 190' may be formed without adding a new process to a conventional manufacturing method of an organic light-emitting display apparatus, and thus the contact resistance of the electrode power supply line 190 and the opposing electrode 230 may be more easily checked.

The method of manufacturing an organic light-emitting display apparatus may include connecting a constant current source to the first test terminal 190a and the second test terminal 190'a, measuring a first voltage of the first test terminal 190b and a second voltage of the second test terminal 190'b, and thereby measuring the contact resistance between the electrode power supply line 190 and the opposing electrode 230. Also, the above method may further include removing the first test terminals 190a and 190b and/or the second test terminals 190'a and 190'b by cutting the substrate 110 along the line l, as shown in FIG. 2, between the first dead area DA1 and the second dead area DA2.

In a method of manufacturing an organic light-emitting display apparatus according to the embodiment of FIG. 6, the substrate 110 having the active area AA and the dead area DA is prepared, and the buffer layer 120 may be formed on the substrate 110.

After the substrate 110 is prepared, the thin film transistors TFT1s disposed in the active area AA of the substrate 110, the electrode power supply line 190 disposed in the dead area DA of the substrate 110 and having the first test terminals 190a and 190b at one end thereof, the connection portion 193 contacting the electrode power supply line 190, and the test line 190' disposed in the dead area DA of the substrate 110 to be separated from the electrode power supply line 190 and the connection portion 193 and having the second test terminals 190'a and 190'b at one end thereof, are formed.

As illustrated in FIG. 6, the gate electrode 150 of the thin film transistor TFT1 and the electrode power supply line 190 may be simultaneously formed on the same layer, and may have the same layer structure and the same materials. The source/drain electrodes 170 of the thin film transistor TFT1, the connection portion 193, and the test line 190' may be simultaneously formed on the same layer, and may have the same layer structure and the same materials.

Next, the pixel electrodes 210 that are disposed in the active area AA of the substrate 110 to be electrically connected to the thin film transistors TFT1s are formed. Then, the opposing electrode 230 is formed to be disposed over the active area AA and the dead area DA of the substrate 110 to correspond to the pixel electrodes 210, to have a surface contact with the connection portion 193, and to contact the test line 190'. Thereby, the organic light-emitting display apparatus may be manufactured.

In some embodiments, the pixel electrode 210 may not be formed after the electrode power supply line 190, the test line 190', and the thin film transistor TFT1 are formed, but rather at the same time as when the thin film transistor TFT1 is formed, as described above with reference to FIG. 5.

In the method of manufacturing an organic light-emitting display apparatus, according to the present embodiment, the test line 190' may be formed without adding a new process to the conventional manufacturing process of an organic light-emitting display apparatus, and thus the contact resistance between the electrode power supply line 190 and the opposing electrode 230 may be more easily checked.

The method of manufacturing an organic light-emitting display apparatus according to the present embodiment may include connecting a constant current source to the first test terminal 190a and the second test terminal 190'a, measuring a first voltage of the first test terminal 190b and a second voltage of the second test terminal 190'b, and thereby measuring the contact resistance between the connection portion 193 and the opposing electrode 230. Also, the above method may further include removing the first test terminals 190a and 190b and/or the second test terminals 190'a and 190'b by cutting the substrate 110 along the line l, as shown in FIG. 2, between the first dead area DA1 and the second dead area DA2.

As described above, according to embodiments of the present invention, the organic light-emitting display apparatus having a structure that can more easily check whether the opposing electrode is electrically connected to the electrode power supply line, without adding an additional process in the manufacturing process, and the method of manufacturing the organic light-emitting display apparatus may be embodied. The present invention is not limited to the above descriptions and effects.

While this invention has been particularly shown and described with reference to exemplary embodiments thereof, it will be understood by those skilled in the art that various changes in form and details may be made herein, without departing from the spirit and scope of the invention, as defined by the appended claims.

What is claimed is:

1. An organic light-emitting display apparatus comprising:
    a substrate having an active area and a dead area;
    a plurality of thin film transistors in the active area of the substrate;
    a plurality of pixel electrodes in the active area of the substrate and electrically connected to corresponding ones of the plurality of thin film transistors;
    an opposing electrode in the active area and the dead area of the substrate corresponding at least to the plurality of pixel electrodes;
    an electrode power supply line in the dead area of the substrate and having a surface contacting the opposing electrode to supply power to the opposing electrode; and
    a test line in the dead area of the substrate, the test line separated from the electrode power supply line and contacting the opposing electrode.

2. The organic light-emitting display apparatus of claim 1, wherein the electrode power supply line is on a same layer as one of source/drain electrodes or a gate electrode of each of the plurality of thin film transistors.

3. The organic light-emitting display apparatus of claim 2, wherein the electrode power supply line has a same layer structure and comprises same material as the one of the source/drain electrodes or the gate electrode of each of the plurality of thin film transistors.

4. The organic light-emitting display apparatus of claim 1, wherein the test line is on a same layer as one of source/drain electrodes or a gate electrode of each of the plurality of thin film transistors.

5. The organic light-emitting display apparatus of claim 4, wherein the test line has a same layer structure and comprises a same material as the one of the source/drain electrodes or the gate electrode of each of the plurality of thin film transistors.

6. The organic light-emitting display apparatus of claim 1, wherein the electrode power supply line is on a same layer as one of source/drain electrodes or a gate electrode of each of the plurality of thin film transistors, and the test line is on a same layer as the other one of the source/drain electrodes or the gate electrode of each of the plurality of thin film transistors.

7. The organic light-emitting display apparatus of claim 1, further comprising:
an interlayer insulating film interposed between source/drain electrodes and a gate electrode of each of the plurality of thin film transistors and arranged over the active area and the dead area of the substrate; and
an external interlayer insulating film in the dead area of the substrate to be separated from the interlayer insulating film and comprising a same material and a same layer structure as the interlayer insulating film,
wherein the electrode power supply line is positioned closer to the active area of the substrate and corresponding to a space between the interlayer insulating film and the external interlayer insulating film, and the test line is positioned farther away from the active area of the substrate and corresponding to the space between the interlayer insulating film and the external interlayer insulating film.

8. The organic light-emitting display apparatus of claim 7, wherein the opposing electrode contacts an end surface of the interlayer insulating film facing the external interlayer insulating film, and wherein the opposing electrode contacts an end surface of the external interlayer insulating film facing the interlayer insulating film.

9. An organic light-emitting display apparatus comprising:
a substrate having an active area and a dead area;
a plurality of thin film transistors in the active area of the substrate;
a plurality of pixel electrodes in the active area of the substrate and electrically connected to corresponding ones of the plurality of thin film transistors;
an opposing electrode in the active area and the dead area of the substrate corresponding at least to the plurality of pixel electrodes;
a connection portion in the dead area of the substrate and having a surface contacting the opposing electrode;
an electrode power supply line contacting the connection portion and configured to supply power to the opposing electrode via the connection portion; and
a test line in the dead area of the substrate, the test line separated from the electrode power supply line and the connection portion and contacting the opposing electrode.

10. The organic light-emitting display apparatus of claim 9, wherein the electrode power supply line is on a same layer as a gate electrode of each of the plurality of thin film transistors.

11. The organic light-emitting display apparatus of claim 10, wherein the electrode power supply line has a same layer structure and comprises a same material as the gate electrode of each of the plurality of thin film transistors.

12. The organic light-emitting display apparatus of claim 10, wherein the connection portion and the test line are on a same layer as source/drain electrodes of each of the plurality of thin film transistors.

13. The organic light-emitting display apparatus of claim 12, wherein the connection portion and the test line have a same layer structure and comprise a same material as the source/drain electrodes of each of the plurality of thin film transistors.

14. A method of manufacturing an organic light-emitting display apparatus, the method comprising:
preparing a substrate having an active area and a dead area;
forming a plurality of thin film transistors in the active area of the substrate, an electrode power supply line in the dead area of the substrate and having a first test terminal, and a test line in the dead area of the substrate separated from the electrode power supply line and having a second test terminal;
forming a plurality of pixel electrodes in the active area of the substrate to be electrically connected to corresponding ones of the plurality of thin film transistors; and
forming an opposing electrode in the active area and the dead area of the substrate corresponding at least to the plurality of pixel electrodes and having a surface contacting the electrode power supply line and contacting the test line.

15. The method of claim 14, wherein, the electrode power supply line has a same layer structure and comprises a same material as one of source/drain electrodes or a gate electrode of each of the plurality of thin film transistors, the electrode being formed on the same layer as the electrode power supply line, and the test line has a same layer structure and comprises a same material as the other one of the source/drain electrodes or the gate electrode of each of the plurality of thin film transistors, the other electrode being formed on the same layer as the test line.

16. The method of claim 14, wherein, one of source/drain electrodes or a gate electrode of each of the thin film transistors, the electrode power supply line, and the test line are formed on a same layer, have a same layer structure, and comprise a same material.

17. The method of claim 14, further comprising connecting a constant current source to the first test terminal and the second test terminal, and measuring a first voltage of the first test terminal and a second voltage of the second test terminal, to measure a contact resistance between the electrode power supply line and the opposing electrode.

18. A method of manufacturing an organic light-emitting display apparatus, the method comprising:
preparing a substrate having an active area and a dead area;
forming a plurality of thin film transistors in the active area of the substrate, an electrode power supply line in the dead area of the substrate and having a first test terminal, a connection portion contacting the electrode power supply line, and a test line in the dead area of the substrate separated from the electrode power supply line and the connection portion and having a second test terminal;
forming a plurality of pixel electrodes in the active area of the substrate to be electrically connected to corresponding ones of the plurality of thin film transistors; and
forming an opposing electrode in the active area and the dead area of the substrate corresponding at least to the plurality of pixel electrodes and having a surface contacting the connection portion and contacting the test line.

19. The method of claim 18, wherein a gate electrode of each of the plurality of thin film transistors and the electrode power supply line are formed on a same layer, have a same layer structure, and comprise a same material, while source/drain electrodes of each of the plurality of thin film transistors and the connection portion are formed on a same layer, have a same layer structure, and comprise a same material, and wherein the test line is formed on the same layer, has the same layer structure, and comprises the same material as one of the electrode power supply line or the connection portion.

20. The method of claim 18, further comprising connecting a constant current source to the first test terminal and the second test terminal, and measuring a first voltage of the first test terminal and a second voltage of the second test terminal, to measure a contact resistance between the connection portion and the opposing electrode.

\* \* \* \* \*